United States Patent [19]

Frankeny et al.

[11] Patent Number: 5,006,924

[45] Date of Patent: Apr. 9, 1991

[54] HEAT SINK FOR UTILIZATION WITH HIGH DENSITY INTEGRATED CIRCUIT SUBSTRATES

[75] Inventors: Richard F. Frankeny, Elgin; Karl Hermann, Austin, both of Tex.

[73] Assignee: International Business Machines Corporation, Armonk, N.Y.

[21] Appl. No.: 459,089

[22] Filed: Dec. 29, 1989

[51] Int. Cl.$^5$ ............... H01L 25/04; H01L 23/16; H01L 23/02; H02B 1/00

[52] U.S. Cl. .......................... 357/82; 357/75; 357/81; 361/382; 361/385; 361/386; 165/80.4

[58] Field of Search ............... 357/81, 82; 361/381, 361/382, 383, 384, 385, 386; 165/80.2, 80.3, 80.4, 80.5

[56] References Cited

U.S. PATENT DOCUMENTS

| | | | |
|---|---|---|---|
| 4,384,168 | 11/1983 | August et al. | 165/80.4 |
| 4,619,316 | 10/1986 | Nakayama et al. | 357/82 |
| 4,750,086 | 6/1988 | Mittal | 361/382 |
| 4,879,632 | 11/1989 | Yamamoto et al. | 357/82 |
| 4,943,844 | 7/1990 | Oscilowski et al. | 357/81 |
| 4,949,219 | 8/1990 | Mariizumi et al. | 357/81 |

FOREIGN PATENT DOCUMENTS

| | | | |
|---|---|---|---|
| 0068142 | 1/1983 | European Pat. Off. | 357/82 |
| 0193747 | 9/1986 | European Pat. Off. | 357/82 |
| 0196054 | 10/1986 | European Pat. Off. | 357/82 |
| 61-279157 | 12/1986 | Japan | 357/82 |
| 63-81959 | 4/1988 | Japan | 357/82 |
| 63-100759 | 5/1988 | Japan | 357/82 |
| 63-226049 | 9/1988 | Japan | 357/82 |
| 119754 | 1/1989 | Japan | 357/82 |

OTHER PUBLICATIONS

Berndlmaier, E. et al., "Liquid-Metal-Cooled Integrated Circuit Module Structures", IBM Technical Disclosure Bulletin, vol. 20, No. 11B, Apr. 1978, pp. 4817-4818.

Ing, P. W., "Self-Cooling Exchanger-Condenser", IBM Technical Disclosure Bulletin, vol. 13, No. 5, p. 1048, Oct. 1970.

Kleinfelder, W. J., & Ronkese, B. J., "Liquid-Filled Bellows Heat Sink", IBM Technical Disclosure Bulletin, vol. 21, No. 10, (Mar. 1979) pp. 4125-4126.

Nufer, R. W., "Semiconductor Chip with Liquid Metal Heat Transfer", IBM Technical Disclosure Bulletin, vol. 22, No. 4, (Sept. 1979), p. 1553.

Hultmark, E. B., Schiller, J. M., & Shepheard, R. G., "Thermal Enhancement of Modules", IBM Technical Disclosure Bulletin, vol. 19, No. 8, (Jan. 1977), p. 3127.

Primary Examiner—Andrew J. James
Assistant Examiner—Cynthia S. Deal
Attorney, Agent, or Firm—Andrew J. Dillon

[57] ABSTRACT

A heat sink for utilization in thermal management of high density integrated circuit substrates is disclosed. Each heat sink includes at least one compliant bag containing a mass of thermally conductive fluid. Within each compliant bag is an aperture which contains a thin pliable metallic membrane having a high Z axis thermal conductivity. The metallic membrane is adapted to slidably mate with a surface of an integrated circuit device to permit relative motion during thermal mismatch while enhancing thermal conductivity from the integrated circuit device into the thermally conductive fluid. A second metallic membrane is preferably mounted to the upper surface of the compliant bag and is thermally coupled to a plurality of cooling fins. In one embodiment of the present invention, a plurality of such compliant bags are serially interconnected and a pump is utilized to circulate fluid through each compliant bag. In this embodiment, a pair of rigidly mounted needle valves may be utilized to automatically couple the fluid pump to the plurality of compliant bags in response to the electrical connection of a substrate incorporating such a heat sink.

6 Claims, 2 Drawing Sheets

HEAT SINK FOR UTILIZATION WITH HIGH DENSITY INTEGRATED CIRCUIT SUBSTRATES

BACKGROUND OF THE INVENTION

1. Technical Field

The present invention relates in general to the field of thermal management and in particular to the field of thermal management in electronic devices of high density integrated circuit substrates. Still more particularly, the present invention relates to the field of heat sink devices which are automatically engaged upon the electrical coupling of an integrated circuit substrate into an electronic device.

2. Description of the Related Art

Due to the fact that excessive temperatures have a well documented adverse effect on electronic components, thermal management within electronic devices has been well known in the prior art. In the early days of electronic devices, excess thermal buildup was generally handled by providing an electrically powered ventilation fan to pull ambient air into a chassis which contained heat generating components. Additionally, known passive thermal management techniques often included a simple mechanical cooling fins which were constructed integrally with certain components or mounted in contact with those devices by means of thermally conductive adhesives.

While the advent of integrated circuit devices initially meant lower thermal buildup, due to the decreased power density of such devices, the increased packing density encountered in current state-of-the-art devices has resulted in a thermal problem due to the high power densities which result from moving the integrated circuit devices closer and closer together.

One known device for aiding in the transfer of heat from closely packaged integrated circuit devices is marketed by the 3M Company of Minneapolis, Minn. under the trademark "FLOURINERT LIQUID HEAT SINK." The thermally conductive fluid identified by the aforementioned trademark is packaged in compliant plastic bags which are then placed over a plurality of integrated circuit devices in a loosely mated manner to attempt to transfer heat from the integrated circuit devices into the thermally conductive fluid. However, this technique is not thoroughly effective in many circumstances due to the lack of thermal bonding between each integrated circuit device and the fluid within the compliant bag. Further, the thermal mismatch which occurs between such bags and integrated circuit devices can often result in stresses being generated in the integrated circuit device mountings due to the unequal thermal coefficients of expansion and contraction which may occur.

It should therefore be apparent that a need exists for an improved thermal management technique which permits the effective transfer of heat from integrated circuit devices to a heat sink while accommodating relative movement between the integrated circuit device and the heat sink which may be caused by a thermal mismatch.

SUMMARY OF THE INVENTION

It is therefore one object of the present invention to provide an improved thermal management technique for use in electronic devices.

It is another object of the present invention to provide an improved thermal management technique for use with high density integrated circuit substrates within electronic devices.

It is yet another object of the present invention to provide an improved thermal management technique for utilization with high density integrated circuit substrates which may be automatically engaged upon the electrical coupling of the integrated circuit substrate into an electronic device.

The foregoing objects are achieved as is now described. Each heat sink constructed in accordance with the method of the present invention includes at least one compliant bag which contains a mass of thermally conductive fluid. Within each compliant bag is an aperture which contains a thin pliable metallic membrane having a high Z axis thermal conductivity. The metallic membrane is adapted to slidably mate with a surface of an integrated circuit device to permit relative motion during thermal mismatch, while enhancing thermal conductivity from the integrated circuit device into the thermally conductive fluid. A second metallic membrane is preferably mounted to the upper surface of the compliant bag and is thermally coupled to a plurality of cooling fins. In one embodiment of the present invention, a plurality of such compliant bags are serially interconnected and a pump is utilized to circulate fluid through each compliant bag. In this embodiment, a pair of rigidly mounted needle valves may be utilized to automatically couple the fluid pump to the plurality of compliant bags in response to the electrical connection of a substrate incorporating the heat sink into an electronic device.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
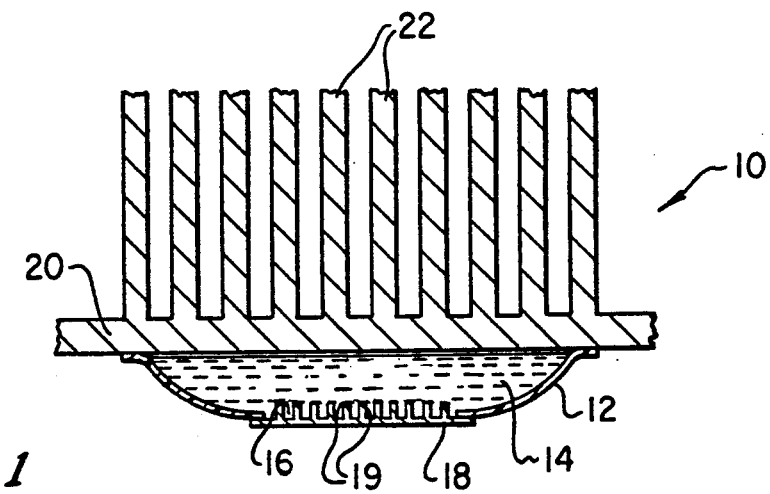
FIG. 1 depicts a sectional side view of a heat sink constructed in accordance with the present invention.

With reference now to the FIGURES, and in particular with reference to FIG. 1, there is depicted a sectional side view of a heat sink 10 which has been constructed in accordance with the present invention. As is illustrated, heat sink 10 includes a compliant bag 12 which is constructed utilizing a thermally stable flexible plastic material such as Kapton or Upilex. Contained within complaint bag 12 is a thermally conductive fluid 14. Any thermally stable thermally conductive fluid may be utilized with the heat sink of the present invention. One such example is the fluid sold commercially by the 3M Company of Minneapolis, Minn. under the trademark "FLOURINERT."

In accordance with an important aspect of the present invention, compliant bag 12 preferably includes an aperture 16 located at the lower surface thereof. Bonded to compliant bag 12 and mounted within aperture 16 is a thin flexible membrane 18. Thin flexible membrane is preferably constructed of a metallic material which has a high Z axis of thermal conductivity. One example of a material which may be utilized to implement flexible membrane 18 is a thin membrane of copper. By utilizing a material having a high Z axis of thermal conductivity the transfer of thermal energy from thin flexible membrane 18 into thermally conductive fluid 14 will be greatly enhanced. Additionally, thin flexible membrane 18 may be roughened on the upper surface thereof to enhance thermal transfer into thermally conductive fluid 14. Actual cooling fins 19 may also be provided to enhance thermal transfer.

As is illustrated in FIG. 1, compliant bag 12 also includes an upper aperture which is sealed using rigid membrane 20. Mounted to rigid membrane 20 are a plurality of cooling fins 22, which may be utilized, in a manner well known in the art, to enhance the transfer of thermal energy from fluid 14 to the atmosphere surrounding cooling fins 22.

Figure 2:
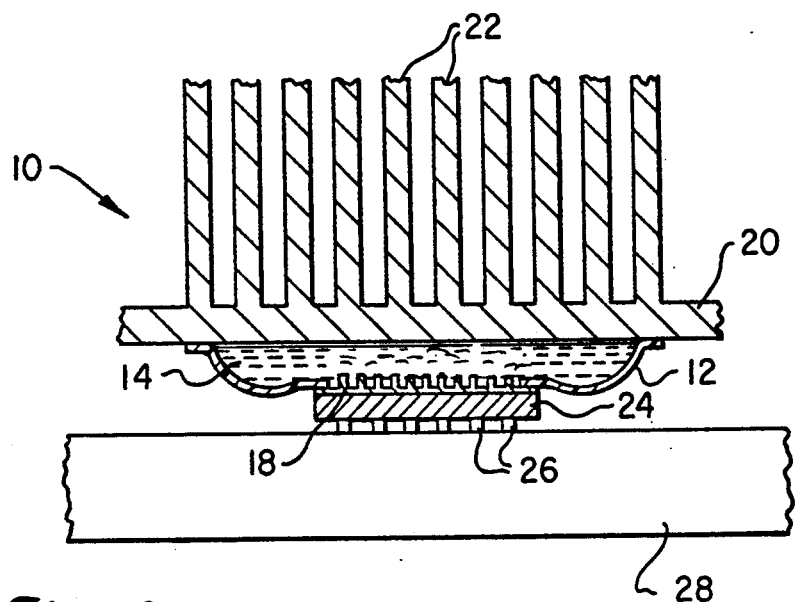
FIG. 2 depicts the heat sink of FIG. 1 in a mated relationship with an integrated circuit device.

Referring now to FIG. 2, there is depicted heat sink 10 of FIG. 1, in a mated relationship with an integrated circuit device 24. As is illustrated, integrated circuit device 24 is preferably mounted to a substrate 28 by means of solder balls 26. Solder balls 26 are preferably provided utilizing a technique known as controlled collapse chip connection (C4) technology. U.S. Pat. Nos. 3,401,126 and 3,429,040 to Lewis F. Miller an assigned to the assignee of the present application disclose this technique whereby the controlled collapse chip connection technique of face down bonding of a semiconductor chip to a carrier may be established.

In general, the techniques described in the Miller patents disclose the formation of a malleable pad of metallic solder on the semiconductor device contact site and the solder joinable sites of the conductors of the chip carrier. The device carrier solder joinable sites are surrounded by non-solderable barriers such that when the solder on the semiconductor device contacts sites melts, surface tension will hold the semiconductor device suspended above the carrier.

As is illustrated, the lower smooth surface of flexible membrane 18 is urged downward into slidable mating contact with integrated circuit device 24 and, as discussed above, thereby enhances the thermal transfer of heat generated by integrated circuit device 24 through flexible membrane 18 and cooling fins 19 into fluid 14. The presence of fluid 14 within compliant bag 12 also serves, as those skilled in the art will appreciate, to equalize the pressure on integrated circuit 24 throughout the entire surface area of flexible membrane 18.

Thus, as is illustrated in FIG. 2, by compressing heat sink 10 downward onto integrated circuit device 24, such that flexible membrane 18 is urged into slidable mating contact with the upper surface of integrated circuit device 24, the thermal energy generated by integrated circuit device 24 will be simply and easily conducted, via thermally conductive fluid 14, to cooling fins 22. By utilizing a smooth material to implement flexible membrane 18, any thermal mismatch which may occur between heat sink 10 an integrated circuit device 24 will be accommodated by the establishment of a slidable contact between flexible membrane 18 and the upper surface of integrated circuit device 24.

Figure 3:
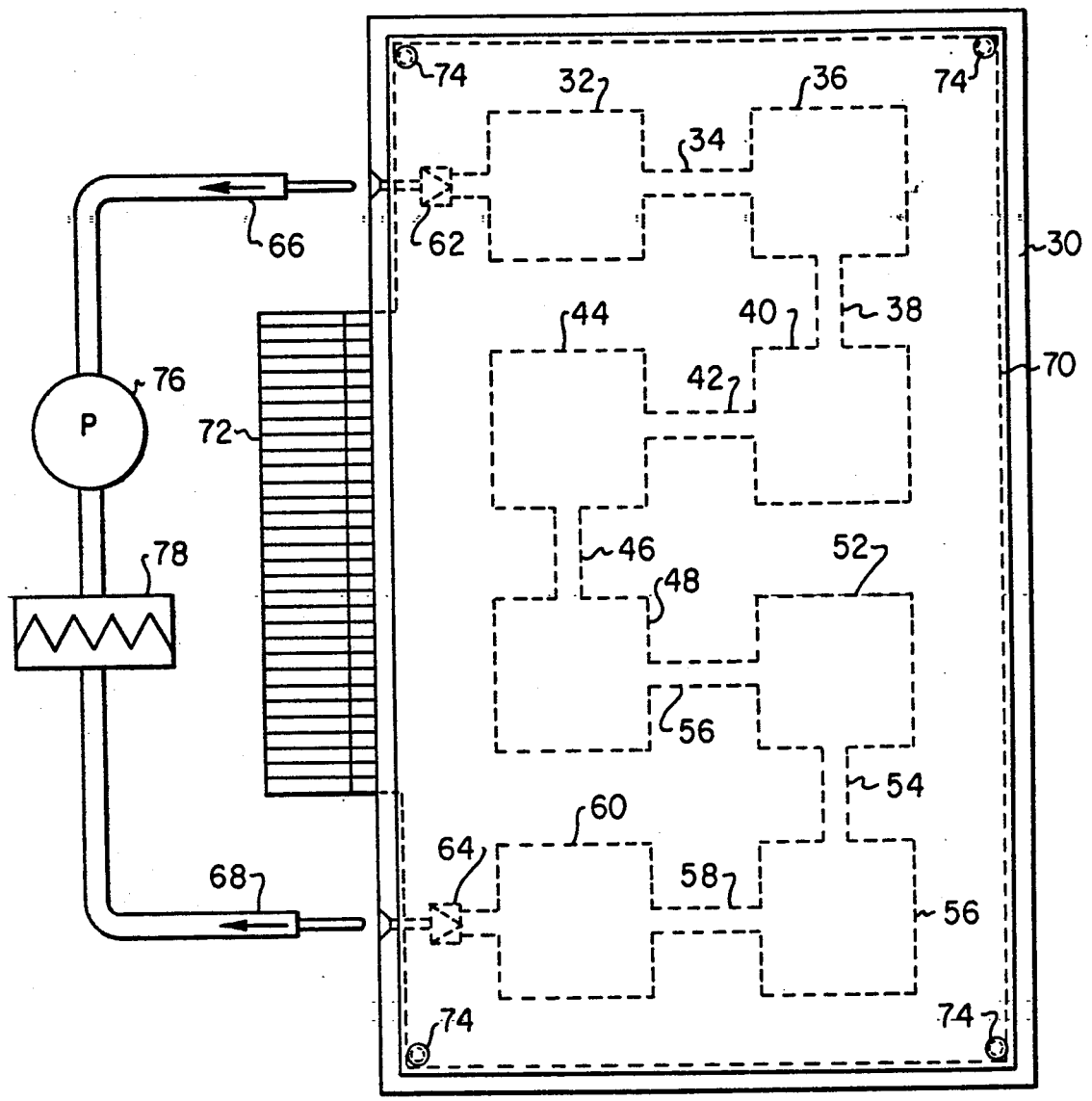
FIG. 3 depicts a partially schematic top view of a multiple integrated circuit device heat sink constructed in accordance with a second embodiment of the present invention.

With reference now to FIG. 3, there is depicted a partially schematic top view of a multiple integrated circuit device heat sink which has been constructed in accordance with a second embodiment of the present invention. As is illustrated in FIG. 3, the multiple integrated circuit device heat sink depicted includes a rigid membrane 30, which is preferably constructed of a highly thermally conductive material such as copper. Etched into the surface of rigid membrane 30 are a plurality of chambers which are preferably associated with a plurality of serially interconnected chambers 32, 36, 40, 44, 48, 52, 56, and 60. As is illustrated, each chamber thus provided may be utilized, by bonding a suitable flexible material thereto, to create a compliant bag similar to conduit bag 12, illustrated in FIGS. 1 and 2. Each compliant bag thus created is serially interconnected by means of multiple passages such as passage 34, 38, 42, 46, 50, 54, and 58. Thus, it should be apparent that any fluid contained within chamber 32 may flow, via passage 34 into chamber 36. Similarly, fluid within chamber 36 may flow via passage 38 into chamber 40. In this manner, each of the compliant bags formed upon the surface of rigid membrane 30 is serially interconnected. Although the various chambers depicted in FIG. 3 are interconnected serially in a serpentine fashion, those skilled in the art will appreciate that these chambers may be interconnected by means of one or more manifolds to permit multiple parallel paths of fluid flow.

As is illustrated in FIG. 3, an input valve 62 and an output valve 64 are provided within chambers 32 and 60 respectively. In this manner, it is possible to couple a source of thermally conductive fluid into chamber 32 via input valve 62 which will thereafter flow through each successive chamber and its associated passageway until such time as it flows out of chamber 60 via output valve 64.

Interconnection between a pressurized source of thermally conductive fluid and the plurality of serially interconnected compliant bags which are created in association with chambers 32, 36, 40, 44, 48, 52, 56, and 60 is preferably accomplished via a pair of rigidly mounted needle valves, such as needle valve 66 and needle valve 68. As is schematically illustrated, input needle valve 66 is preferably coupled to a pump 76 which serves to pump thermally conductive fluid from reservoir 78 into the plurality of serially interconnected compliant bags. Thermally conductive fluid which flows out of output valve 64 via needle valve 68 will then flow into reservoir 78 in a manner well known in the fluid pumping art.

Figure 4:
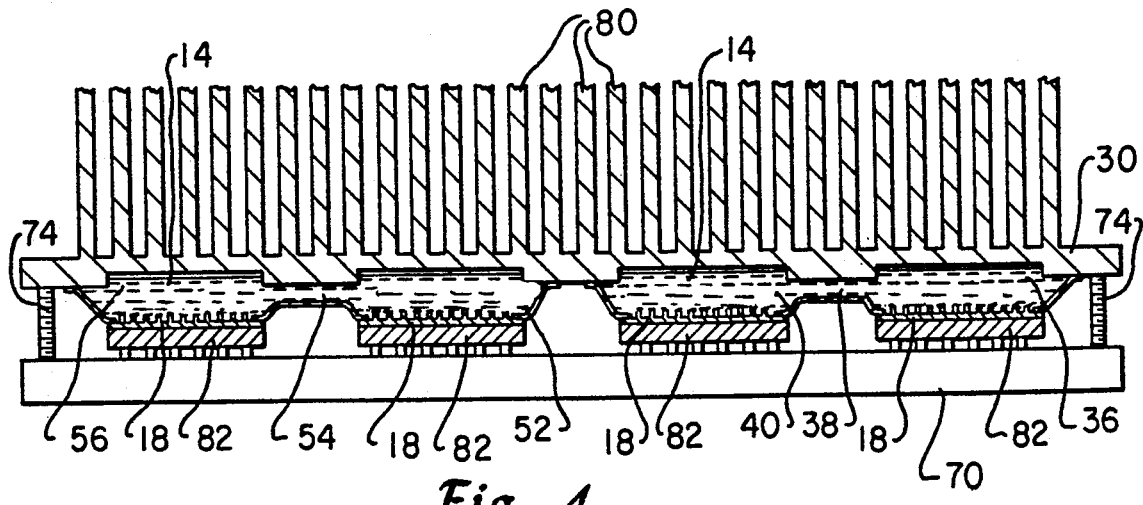
FIG. 4 depicts a side view of the multiple integrated circuit device heat sink of FIG. 3.

As will be illustrated in greater detail within FIG. 4, an integrated circuit substrate 70 (shown in phantom) may thereafter be mounted to rigid membrane 30 via a plurality of flexible mounting studs 74, in a manner which will permit each compliant bag created to be urged into slidable mating contact with a surface of an integrated circuit device, in the manner illustrated in FIG. 1 and 2. In accordance with an important feature of the present invention, substrate 70 preferably includes an electrical connector 72, which is provided utilizing an edge connector or other similar well known device. By placing electrical connector 72 at the edge of substrate 70 which is adjacent to input valve 62 and output valve 64 it will be possible to automatically couple the plurality of serially interconnected compliant bags within the heat sink illustrated in FIG. 3 to pump 76 and reservoir 78 in response to the mating of electrical connector 72 into an appropriate electrical receptacle. In this manner, an associated heat sink may be provided and mounted with each integrated circuit substrate such that upon the plugging of the integrated circuit substrate into an electronic device a cooling system will be automatically actuated.

Finally, referring to FIG. 4, there is illustrated a side view of the multiple integrated circuit device heat sink of FIG. 3. As is illustrated, substrate 70 includes a plurality of integrated circuit devices 82 which are mounted thereon in a manner described in greater detail above. Mounted directly above substrate 70, by means of flexible mounting studs 74, is rigid membrane 30 which, in the preferred embodiment of the present invention, includes a plurality of cooling fins 80 which are utilized to facilitate the transfer of thermal energy from each integrated circuit device 82 to the surrounding atmosphere.

As is illustrated, a plurality of serially interconnected chambers 36, 40, 52, and 56 are formed in the manner described above with respect to FIGS. 1 and 2. In a manner similar to that depicted within FIGS. 1 and 2, a flexible membrane 18 is provided in conjunction with each compliant bag to permit a slidable mating relationship to be established between the heat sink and each integrated circuit device and to enhance the conduction of thermal energy from each integrated circuit device 82 to the thermally conductive fluid 14 contained within the heat sink.

Upon reference to the foregoing, those skilled in the art will appreciate that the Applicants in the present invention have provided a heat sink which may be utilized with high density integrated circuit substrates which enhances the conductivity of thermal energy from each integrated circuit device into the heat sink and which permits slidable contact between each integrated circuit device and the heat sink to accommodate any movement which may occur due to thermal mismatch. In this manner, the heat sink of the present invention provides a highly efficient manner of transferring thermal energy from an integrated circuit device to the atmosphere while minimizing the physical strain which can occur in such substrates due to thermal mismatch.

While the invention has been particularly shown and described with reference to a preferred embodiment, it will be understood by those skilled in the art that various changes in form and detail may be made therein without departing from the spirit and scope of the invention.

We claim:

1. A heat sink system for use with multiple integrated circuit devices mounted in a planar configuration upon a circuit substrate having an electrical connector disposed along one edge thereof, said heat sink system comprising:

a rigid thermally conductive substrate mounted in fixed relationship adjacent to said circuit membrane;

a plurality of serially interconnected compliant bags mounted to said rigid thermally conductive substrate, each of said plurality of serially interconnected compliant bags mounted in a mated relationship with one of said multiple integrated circuit devices;

an input valve mounted in fixed relationship with a first of said plurality of serially interconnected compliant bags for coupling thermally conductive fluid into said first compliant bag;

an output valve mounted in fixed relationship with a second of said plurality of serially interconnected bags for coupling thermally conductive fluid out of said second complaint bag; and a source of pressurized thermally conductive fluid having an input connector and an output connector mounted in fixed relationship with an appropriate electrical receptacle wherein connection of said electrical connector of said circuit substrate to said appropriate electrical connector will couple said input connector to said input valve and said output connector to said output valve whereby said heat sink system will be automatically actuated.

2. The heat sink system for use with multiple integrated circuit devices mounted in a planar configuration upon a circuit substrate having an electrical connector disposed along one edge thereof according to claim 1, wherein said rigid thermally conductive membrane comprises a copper planar member.

3. The heat sink system for use with multiple integrated circuit devices mounted in a planar configuration upon a circuit substrate having an electrical connector disposed along one edge thereof according to claim 1, wherein each of said serially interconnected compliant bags comprises a compliant bag constructed of a thermally stable flexible plastic material.

4. The heat sink system for use with multiple integrated circuit devices mounted in a planar configuration upon a circuit substrate having an electrical connector disposed along one edge thereof according to claim 3, wherein each of said serially interconnected compliant bags includes an aperture therein having a flexible metallic membrane mounted therein.

5. The heat sink system for use with multiple integrated circuit devices mounted in a planar configuration upon a circuit substrate having an electrical connector disposed along one edge thereof according to claim 1, wherein said source of pressurized thermally conductive fluid comprises a reservoir for containing said thermally conductive fluid and an associated pump.

6. The heat sink system for use with multiple integrated circuit devices mounted in a planar configuration upon a circuit substrate having an electrical connector disposed along one edge thereof according to claim 5, wherein said input connector and said output connector each comprises a needle valve.

* * * * *